United States Patent
Saleh et al.

(10) Patent No.: US 11,734,487 B2
(45) Date of Patent: Aug. 22, 2023

(54) OBSCURED METAL STACK DEFINITION TUNING FOR ELECTRONIC DESIGN AUTOMATION (EDA) APPLICATIONS

(71) Applicant: Siemens Industry Software Inc., Plano, TX (US)

(72) Inventors: Mohamed Saleh Abouelyazid Saleh, Cairo (EG); James K. Falbo, Tualatin, OR (US)

(73) Assignee: Siemens Industry Software Inc., Plano, TX (US)

( * ) Notice: Subject to any disclaimer, the term of this patent is extended or adjusted under 35 U.S.C. 154(b) by 164 days.

(21) Appl. No.: 17/329,614

(22) Filed: May 25, 2021

(65) Prior Publication Data

US 2022/0382952 A1 Dec. 1, 2022

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .. G06F 30/392; G06F 30/398; G06F 2111/04; G06F 2119/02; G06F 2119/10; G06F 30/327; G06F 30/337; G06F 30/367; G06F 13/1694; G06F 30/394; G06F 30/39; G06F 30/3308; G06F 2119/04; G06F 30/20; G06F 30/30; G06F 2111/14; G06F 2119/18; G06F 30/00; G06F 30/23; G06F 30/33; G06F 2117/10; G06F 2119/06; G06F 2119/12; H01L 27/14647; H01L 29/06; H01L 33/0093; H01L 29/78684; H01L 29/66; H01L 27/14652; H01L 23/5222; H01L 23/5227; H01L 28/10; H01L 27/0207; H01L 27/1211; H01L 25/0657; H01L 29/42316; G03F 1/70; G03F 7/70466; G03F 7/705
USPC .................................................. 716/110–116
See application file for complete search history.

(56) References Cited

U.S. PATENT DOCUMENTS

| | | | |
|---|---|---|---|
| 9,092,591 B2* | 7/2015 | Alpert | .................. G06F 30/394 |
| 2014/0195998 A1* | 7/2014 | Alpert | .................. G06F 30/327 |
| | | | 716/130 |
| 2016/0204207 A1* | 7/2016 | Then | .................. H01L 29/42392 |
| | | | 438/285 |
| 2020/0105739 A1* | 4/2020 | Yang | .................. H01L 27/088 |

* cited by examiner

*Primary Examiner* — Binh C Tat

(57) ABSTRACT

A computing system may include a metal stack tuning engine and a tuned metal stack application engine. The metal stack tuning engine may be configured to access an obscured metal stack definition specified for an integrated circuit (IC) manufacture process and tune selected metal stack parameters of the obscured metal stack definition to obtain a tuned metal stack definition. The metal stack tuning engine may do so by generating sampled metal stack definitions, constructing sampled layout geometries from the sampled metal stack definitions, computing parasitic capacitance value sets for the sampled layout geometries, and determining tuned values for the selected metal stack parameters through a curve fitting process. The tuned metal stack application engine may be configured to use the tuned metal stack definition to perform a parasitic capacitance extraction process for an input IC design.

20 Claims, 8 Drawing Sheets

OBSCURED METAL STACK DEFINITION TUNING FOR ELECTRONIC DESIGN AUTOMATION (EDA) APPLICATIONS

BACKGROUND

Electronic circuits, such as integrated circuits, are used in nearly every facet of modern society, from automobiles to microwaves to personal computers. Design of circuits may involve many steps, known as a "design flow." The particular steps of a design flow are often dependent upon the type of microcircuit being designed, its complexity, the design team, and the circuit fabricator or foundry that will manufacture the circuit. Electronic design automation (EDA) applications support the design and verification of circuits prior to fabrication. EDA applications may implement various EDA procedures, e.g., functions, tools, or features to analyze, test, or verify a circuit design at various stages of the design flow.

BRIEF DESCRIPTION OF THE DRAWINGS

Certain examples are described in the following detailed description and in reference to the drawings.

DETAILED DESCRIPTION

Figure 1:
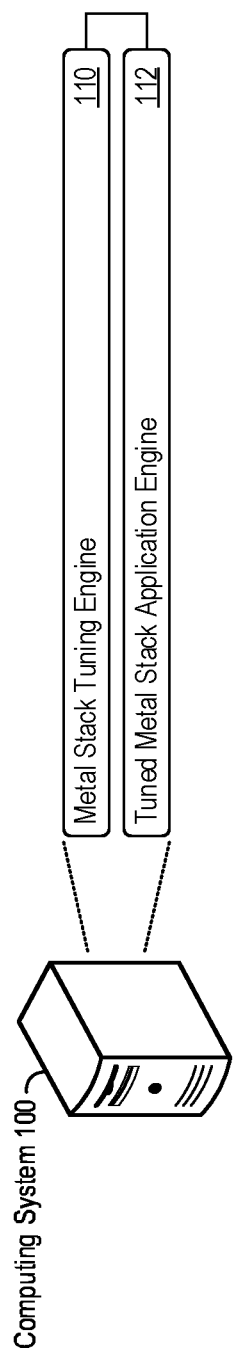
FIG. 1 shows an example of a computing system that supports tuning of obscured metal stack definitions in support of integrated circuit (IC) manufacture.

As modern technology continues to advance, the design, verification, and manufacture of increasingly complex integrated circuits (IC) becomes more feasible. Modern fabrication processes can support IC technology nodes that continue to decrease in size, which may allow for chip designs of the same physical size with increased functionality, transistor counts, or features as compared to previous chip generations. As part of the advances in the complexity and capability of circuit designs, foundries (e.g., IC manufacturers or semiconductor fabrication plants) may invest significant resources into fabrication technology, fabrication devices, and dedicated IC fabrication processes in support of advanced technology nodes. Such investments into fabrication technology may allow foundries to develop specific techniques to manufacture chip designs.

In support of IC fabrication (also referred to herein as IC manufacture), a foundry may develop metal stack definitions for IC manufacturing processes supported by the foundry. As used herein, a metal stack definition may refer to any set of parameters specific to an IC manufacturing process, and may thus include parameters that specify how the metal stack of ICs manufactured by the foundry are formed. Metal stack definitions may be specific to a technology node, and may also be referred to as (or otherwise include elements of) metal stack technology, process stacks, interconnect technology formats, interconnect stacks, etc. Metal stack definitions may be different or distinct from circuit layouts, in that a metal stack definition may define parameters that govern the size, spacing, interconnects, or other characteristics of the physical components (e.g., transistors) that comprise a circuit layout, whereas a layout may specify the locations of physical components placed in the circuit design. Example metal stack parameters that a metal stack definition can specify include transistor device-level parameters, device-layer thicknesses, trapezoidal slope features, metal layer and transistor thicknesses and elevations, dielectric characteristics, transistor structural parameters, raised source drain (RSD) spacing, and more. Metal stack parameters may additionally or alternatively specify device-level electrical parameters, such as resistivity, dielectric permittivity (eps), sheet resistances (rsh), and more.

Since a metal stack definition may provide information into how foundries specifically approach IC manufacture at different technology nodes, many foundries may seek to keep their metal stack definitions confidential or proprietary, at least in part and especially for advanced technology nodes. To keep specific parameter values of its actual metal stack definition concealed, a foundry may provide an obscured metal definition for use in circuit analysis and verification processes. As used herein, an obscured metal stack definition for an IC manufacture process may be any metal stack definition that includes metal stack parameters that are different from actual metal stack parameters of the metal stack definition used by a foundry for the IC manufacture process. Obscured metal stack definitions may thus have adjusted parameter values (e.g., elevation or RSD values) that vary slightly from the actual values of the metal stack parameters in an actual metal stack definition used by a foundry. As another example, parameter adjustments by obscured metal stack definitions may include hidden, simplified, or combined metal stack parameters that obfuscate the actual parameter values of the foundry's metal stack definition.

Circuit analysis and verification processes may utilize metal stack definitions to generate 3D geometries and circuit layouts in order to properly verify circuit properties. Obscured metal stack definitions, while keeping at least some of the actual metal stack parameters used by foundries confidential, may limit the degree of accuracy that circuit analysis and verification processes can provide. While foundries may aim to obscure their actual metal stack definitions to nonetheless approximate similar metal stack, interconnect, and transistor-level device characteristics of circuit designs for circuit verification purposes, even slight differences in 3D circuit geometries caused by such obfuscation may result in inaccurate circuit verifications. For example, modern EDA parasitic extraction tools may be incapable of determining parasitic capacitance values for circuit designs via obscured metal stack definitions at threshold accuracy levels to avoid circuit defects. This may be the case as obscured metal stack definitions may result in analysis of 3D layout geometries that are different as those that are generated from an actual metal stack definition of a foundry. These (perhaps seemingly minor) differences that occur in 3D layout geometry generation may result in calculation differences in parasitic extraction processes and parasitic capacitance value determinations, and improper circuit verifications can ultimately cause manufacturing defects, circuit failure, and lower yield in IC manufacture. As such, conventional parasitic extraction and other circuit verification processes may not yield sufficiently accurate results through obscured metal stack definitions provided by foundries.

The disclosure herein may provide systems, methods, devices, and logic for tuning of obscured metal stack definitions in support of IC manufacture. The metal stack tuning technology described herein may support the tuning of any number of selected metal stack parameters of an obscured metal stack definition in order to increase the degree to which 3D geometry and circuit layouts generated from tuned metal stack definitions correlate to device-level structures constructed from the actual (e.g., unobscured) metal stack definitions used by foundries. As such, tuned metal stack definitions produced according to the present disclosure may in turn increase the accuracy of circuit analysis and verification processes, including parasitic extraction. In particular, the metal stack tuning technology described herein may provide for generation of sets of sampled metal stack definitions from an obscured metal stack definition as well generating sampled layout geometries and computing parasitic capacitance value sets from the sampled layout geometries. These computed parasitic capacitance value sets may collectively form a lookup table that can, in effect, represent a function with input variables in the form of the selected metal stack parameters.

By leveraging curve-fitting processes, the metal stack tuning technology described herein may determine the tuned values for the unknown variables of the function represented through the computed parasitic capacitance value sets of the sampled layout geometries. The tuning of these unknown variables (e.g., the selected metal stack parameters) may effectuate tuning of the selected metal stack parameters values of the obscured metal stack definition in order to more closely approximate an actual metal stack definition. Curve-fitting (e.g., multi-variable non-linear regression) may be performed to fit the function output to golden reference values, and such golden reference values may be determined via an actual metal stack definition (e.g., determined and provided by a foundry). In such a manner, the metal stack tuning technology described herein may tune parameter values of an obscured metal stack definition, which may increase the accuracy at the obscured metal stack definition approximates an actual metal stack definition. As a technical advantage, the metal stack tuning technology may support such tuning of obscured metal stack definitions without having to expose actual metal stack parameter values of the actual metal stack definition that were obscured in the obscured metal stack definition. As such, the metal stack tuning technology described herein may preserve the confidentiality of foundry IC manufacturing techniques while also providing the capability of EDA applications to accurately analyze and verify circuit designs via obscured metal stack definitions provided by foundries.

These and other aspects of metal stack tuning technology according to the present disclosure and the technical benefits of such metal stack tuning technology are described in greater detail herein.

FIG. 1 shows an example of a computing system 100 that supports tuning of obscured metal stack definitions in support of IC manufacture. The computing system 100 may take the form of a single or multiple computing devices such as application servers, compute nodes, desktop or laptop computers, smart phones or other mobile devices, tablet devices, embedded controllers, and more. In some implementations, the computing system 100 hosts, instantiates, executes, supports, or implements an EDA application that supports circuit design and analysis, and may accordingly provide or implement any of the metal stack tuning technology described herein.

As an example implementation to support any combination of the metal stack tuning technology described herein, the computing system 100 shown in FIG. 1 includes a metal stack tuning engine 110 and a tuned metal stack application engine 112. The computing system 100 may implement the engines 110 and 112 (including components thereof) in various ways, for example as hardware and programming. The programming for the engines 110 and 112 may take the form of processor-executable instructions stored on a non-transitory machine-readable storage medium and the hardware for the engines 110 and 112 may include a processor to execute those instructions. A processor may take the form of single processor or multi-processor systems, and in some examples, the computing system 100 implements multiple engines using the same computing system features or hardware components (e.g., a common processor or a common storage medium).

In operation, the metal stack tuning engine 110 may access an obscured metal stack definition specified for an IC manufacture process, and the obscured metal stack definition may include metal stack parameters that are different from actual metal stack parameters of an actual metal stack definition for the IC manufacture process. In operation, the metal stack tuning engine 110 may also tune selected metal stack parameters of the obscured metal stack definition to obtain a tuned metal stack definition. The metal stack tuning engine 110 may do so by generating sampled metal stack definitions, wherein each sampled metal stack definition has a sampled value for each of the selected metal stack parameters, constructing sampled layout geometries from the sampled metal stack definitions, wherein a given sampled layout geometry is constructed from a physical layout of a reference IC design using a given sampled metal stack definition, computing parasitic capacitance value sets for the sampled layout geometries, wherein a parasitic capacitance value set computed for a given sampled layout geometry comprises parasitic capacitance values computed for IC components of the given sampled layout geometry, and determining tuned values for the selected metal stack parameters through a curve fitting process, wherein the tuned values are represented as unknown variables of a function represented through the computed parasitic capacitance value sets that the curve fitting process fits to golden reference values. In operation, the tuned metal stack application engine 112 may use the tuned metal stack definition to perform a parasitic capacitance extraction process for an input IC design different from the reference IC design.

These and other aspects of metal stack tuning technology according to the present disclosure are described in greater detail next. To tune selected metal stack parameters of an obscured metal stack definition, the metal stack tuning technology described herein may generate a set of sampled metal stack definitions, as described next with reference to FIG. 2.

Figure 2:
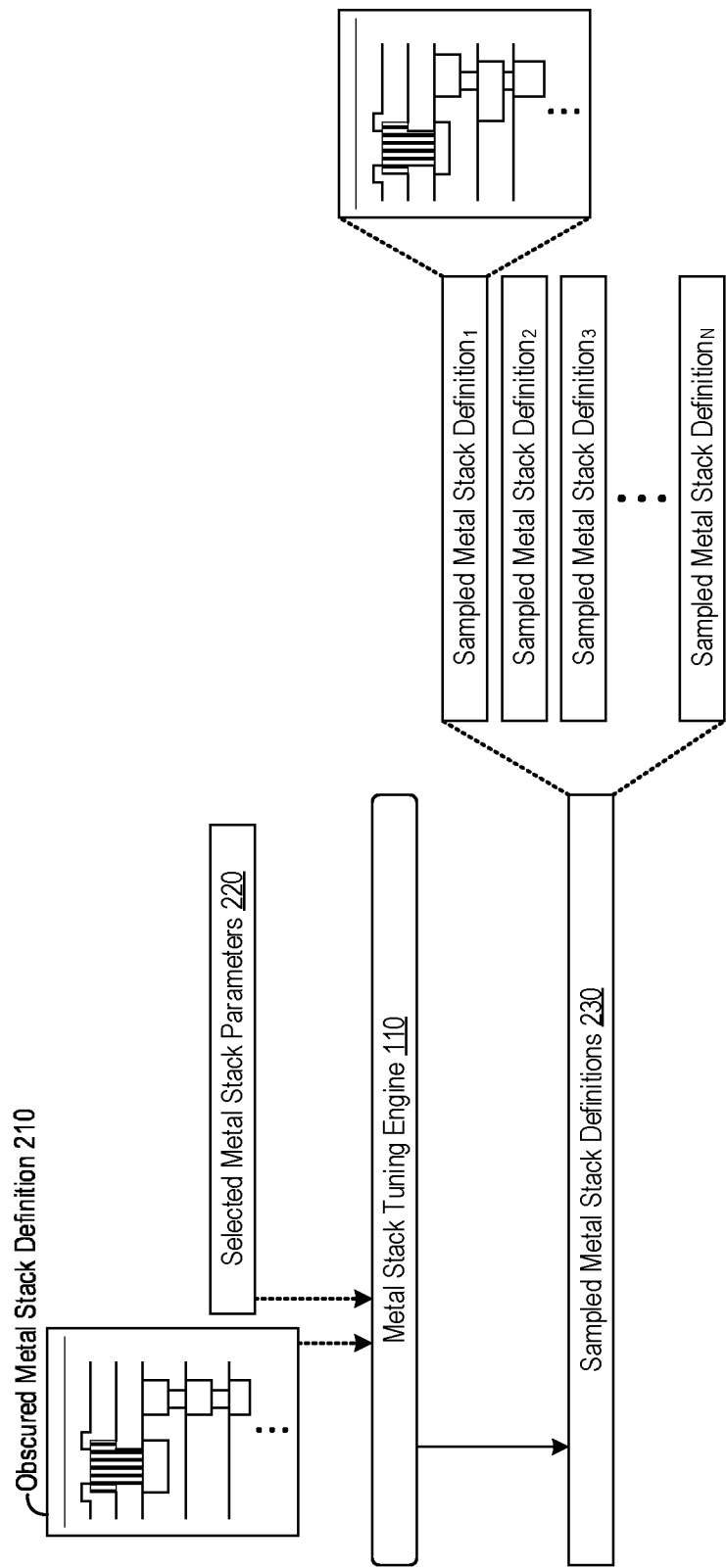
FIG. 2 shows an example generation of sampled metal stack definitions from an obscured metal stack definition.

FIG. 2 shows an example generation of sampled metal stack definitions from an obscured metal stack definition. In the example of FIG. 2, the metal stack tuning engine 110 generates sampled metal stack definitions for the obscured metal stack definition 210 and the selected metal stack parameters 220. The metal stack tuning engine 110 may access the obscured metal stack definition 210 in any number of ways, for example by loading the obscured metal stack definition 210 from a local or remote memory, receiving the obscured metal stack definition 210 via a local or wide area communication network, via user input or selection, or in various other ways. The obscured metal stack definition 210 may be provided by a foundry.

As noted herein, the obscured metal stack definition 210 may include metal stack parameters that are different from actual metal stack parameters of an actual metal stack definition for the IC manufacture process. This may mean that parameter values of the obscured metal stack definition 210 may differ from the actual parameter values of the actual metal stack definition used by a foundry in its IC manufacturing processes. Or, this may mean that the obscured metal stack definition 210 may hide (e.g., remove or delete) certain metal stack parameter values and instead compensate or reflect the effect of these hidden metal stack parameter values via other metal stack parameters. As an illustrative example, the obscured metal stack definition 210 may hide some transistor-related parameters (e.g., FINFET or MOS planar parameters) and hide aspects of the metallization of transistor devices in the obscured metal stack definition 210. Instead, the obscured metal stack definition 210 may compensate for or reflect the effects of the obscured transistor metallization parameters through other electrical or geometrical parameters included in the obscured metal stack definition 210, such as dielectric constant values, resistivity values, correction values, metal thicknesses, elevations, trapezoidal slope values, RSD spacing, and the like. While the obscured metal stack definition 210 may attempt to approximate or reflect effects of hidden or obscured metal stack parameters specified in the obscured metal stack definition 210, many times the obscured metal stack definition 210 (without tuning) cannot support threshold accuracy requirements for parasitic extraction processes and other circuit verification techniques.

To address such shortcomings and inaccuracies in obscured metal stack definitions, the metal stack tuning engine 110 may tune any number of metal stack parameters of obscured metal stack definitions. For the example shown in FIG. 2, the metal stack tuning engine 110 may determine tuned values specifically for the selected metal stack parameters 220, which the metal stack tuning engine 110 may identify via user input, as a predetermined subset of the metal stack parameters of the obscured metal stack definition 210, through EDA application defaults, or in any other suitable selection mechanism. In some implementations, the metal stack tuning engine 110 may limit the number of metal stack parameters that can be selected for tuning according to a threshold number (e.g., equal to or less than a preconfigured threshold number, which may be a system default or user-specified limit). The greater the number of metal stack parameters to tune for the obscured metal stack definition 210, the greater the computational strain may be to do so. As such, limiting the number of metal stack parameters to tune may yield similar accuracy benefits when the selected metal stack parameters 220 are strategically or purposefully determined, but while also reducing computational resource strain that may be present if the selected metal stack parameters were to be indiscriminately selected and unlimited in number.

The selected metal stack parameters 220 may be a subset of the total metal stack parameters specified in the obscured metal stack definition 210 and may represent the specific metal stack parameters that the metal stack tuning engine 110 will determine tuned parameter values. To support such tuning, the metal stack tuning engine 110 may examine or determine the impact of the selected metal stack parameters 220 on parasitic extraction or other circuit verification processes and tune (e.g., adjust or otherwise compensate for) the parameter values of the selected metal stack parameters in the obscured metal stack definition 210. In support of such tuning, the metal stack tuning engine 110 may evaluate, quantify, or determine impacts of varying the parameter values of the selected metal stack parameters 220 on parasitic extractions or other circuit analyses and verification processes.

In some implementations, the metal stack tuning engine 110 may generate sampled metal stack definitions from the obscured metal stack definition 210. The sampled metal stack definitions may be a set of metal stack definitions that vary in value for the selected metal stack parameters 220 from the obscured metal stack definition 210. Each sampled metal stack definition may include parameters values for the selected metal stack parameters 220 sampled from a respective value range applicable to each of the selected metal stack parameters 220. Thus, each of the generated sampled metal stack definitions may differ from the obscured metal stack definition 210 (and one another) in parameter values for the selected metal stack parameters 220, but within specified value ranges applicable to the selected metal stack parameters 220.

As an illustrative example, one of the selected metal stack parameters 220 may be a minimum width of a first inter-layer metal, and the obscured metal stack definition 210 accessed by the metal stack tuning engine 110 may specify a parameter value of 0.1 micrometers ($\mu m$) for this first inter-layer metal stack parameter. In generating sampled metal stack definitions from the obscured metal stack definition 210, the metal stack tuning engine 110 may apply a 0.01 $\mu m$ sample range for this first inter-layer metal stack parameter, with the value range centered at the specified 0.1 $\mu m$ parameter value. Within this 0.01 $\mu m$ sample range between 0.095 $\mu m$-0.105 $\mu m$, the metal stack tuning engine 110 may sample values for this first inter-layer metal stack parameter, and generated sampled metal stack definitions may include a parameter value sampled between 0.095 $\mu m$-0.105 $\mu m$ for this metal stack parameter that specifies the minimum width of a first inter-layer metal. In a similar manner, the metal stack tuning engine 110 may sample values for others of the selected metal stack parameter values 220 in generating various sampled metal stack definitions.

The value range from which to sample parameter values for a given selected metal stack parameter may be configured in various ways, whether through user input, as pre-configured system defaults, or through other means. In some implementations, the metal stack tuning engine 110 may additionally or alternatively generate sampled metal stack definitions to include specified parameter values (whether within a sample range or not). For instance, a user input may specify that at least some of the generated metal stack definitions for an obscured metal stack definition 210 specifically include a 0.113 $\mu m$ parameter value for the minimum width of a first inter-layer metal. The metal stack tuning engine 110 may generate sampled metal stack definitions such that the user-specified 0.113 $\mu m$ parameter value for the minimum width of a first inter-layer metal is specified among at least some of the sampled metal stack definitions, while also generating other metal stack definitions with parameter values sampled within a value range for the minimum width of the first inter-layer metal.

The metal stack tuning engine 110 may generate sampled metal stack definitions such that parameter values for each of the selected metal stack parameters 220 are sampled across different value ranges. In the example shown in FIG. 2, the metal stack tuning engine 110 generates the sampled metal stack definitions 230 for the obscured metal stack definition 210 and the selected metal stack parameters 220. The number of different metal stack definitions in the sampled metal stack definitions 230 may vary based on the total number of the selected metal stack parameters 220 and any degree to which any of the selected metal stack parameters 220 are interdependent with one another (e.g., the value of a given selected metal stack parameter is directly proportional, limited by, or dependent upon a different selected metal stack parameter). In cases of interdependency, sampling the parameter value of a first selected metal stack parameter may necessarily specify, limit, or set the parameter value of a second selected metal stack parameter (or vice versa). In such cases, a lesser number of sampled metal stack definitions 230 may be generated by the metal stack tuning engine 110 to nonetheless sample and cover value ranges in generation of the sampled metal stack definitions 230.

The metal stack tuning engine 110 may generate any number of sampled metal stack definitions 230 from the obscured metal stack definitions 210 for the selected metal stack parameters 220. As non-limiting examples, the number of sampled metal stack definitions 230 generated for an obscured metal stack definition 210 may be in the hundreds, thousands, or more. In some implementations, the metal stack tuning engine 110 may limit the number of sampled metal stack definitions 230 generated from the obscured metal stack definition 210 to an upper threshold. Parameter values of the sampled metal stack definitions 230 for other metal stack parameters beside the selected metal stack parameters 220 may remain the same as those of the obscured metal stack definition 210, and thus the metal stack tuning engine 110 may limit differences between the sampled metal stack definitions 230 and the obscured metal stack definition to parameter values of the selected metal stack parameters 220.

The sampled metal stack definitions 230 generated for the obscured metal stack definition 210 may represent different variations from the obscured metal stack definition 210, wherein such variances can be controlled to be within a threshold value range for each of the selected metal stack parameters 220 specified for the obscured metal stack definition 210. The metal stack tuning engine 110 may evaluate, process, determine, map, quantify, or otherwise track how the variations in value to these selected metal stack parameters 220 (as reflected in the sampled metal stack definitions 230) impact the accuracy of parasitic extractions or other circuit verification processes, which may then allow the metal stack tuning engine 110 tune the selected metal stack parameters 220 based on golden reference values determined for parasitic extraction or other circuit verification processes. To do so, the metal stack tuning engine 110 may generate 3D layout geometries using the sampled metal stack definitions 230 and perform capacitance value determinations for generated 3D layout geometries, as discussed in greater detail next with reference to FIGS. 3 and 4.

Figure 3:
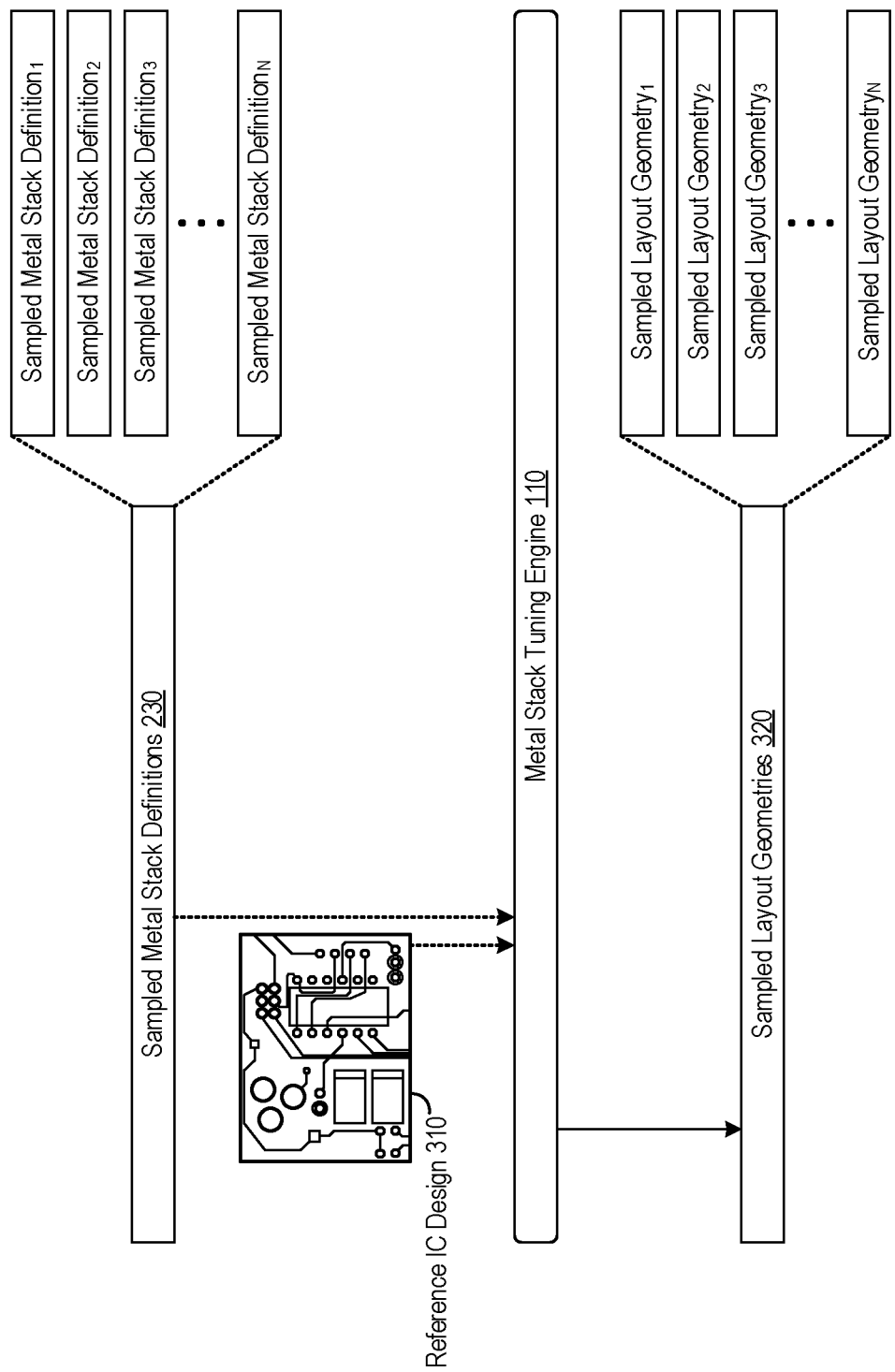
FIG. 3 shows an example construction of sampled layout geometries from sampled metal stack definitions.

FIG. 3 shows an example construction of sampled layout geometries from sampled metal stack definitions. In the example of FIG. 3, the metal stack tuning engine 110 may access the sampled metal stack definitions 230 and a reference IC design 310 (e.g., a physical layout). As the sampled metal stack definitions 230 may specify metal stack parameters generally applicable to a circuit design (e.g., transistor-level structural characteristics, metallization parameters, electrical parameters, etc.), the reference IC design 310 may provide a circuit layout unto which the sampled metal stack definitions 230 can be applied. The reference IC design 310 may be in the form of a physical layout, for example as Graphic Design System II (GDSII) or Open Artwork System Interchange Standard (OASIS) layout files. The reference IC design 310 may be any of circuit type, for example as provided by a foundry with the obscured metal stack definition 210 to support metal stack tuning. Together, the reference IC design 310 and a sampled metal stack definition can be used to construct a 3D layout geometry that can be processed, e.g., capacitance determinations. While FIG. 3 shows a single reference IC design through reference IC design 310, this is for illustrative purposes only. The metal stack tuning engine 110 may use any number of reference IC designs to generate sampled layout geometries and perform subsequent parasitic capacitance computations and curve-fitting.

In FIG. 3, the metal stack tuning engine 110 constructs the sampled layout geometries 320 from the sampled metal stack definitions 230. Each sampled layout geometry of the sampled layout geometries 320 may be constructed from a physical layout of the reference IC design 310 using a corresponding sampled metal stack definition of the sampled metal stack definitions 230. The sampled layout geometries 320 may thus comprise 3D layout geometries, with a separate 3D layout geometry for each of the sampled metal stack definitions 230. There may be a 1:1 correspondence between elements of the sampled metal stack definitions 230 and the sampled layout geometries 320 generated from the reference IC design 310. With multiple reference IC designs, a single sampled metal stack definition may correlate (e.g., be used to generate) multiple sampled layout geometries (e.g., one for each reference IC design). As each individual sampled metal stack definition of the sampled metal stack definitions 230 may vary in parameter values for the selected metal stack parameters 220, each constructed layout geometry of the sampled layout geometries 320 may differ from one another as well. In that regard, the sampled layout geometries 320 may collectively form a set of varying 3D layout geometries constructed from the same physical layout, but differ based on the varying parameter values of the sampled metal stack definitions 230. In some implementations, the sampled layout geometries 320 constructed by the metal stack tuning engine 110 may include a 3D layout geometry constructed from the obscured metal stack definition 210 as well.

The construction of the 3D layout geometries of the sampled layout geometries 320 may be performed by the metal stack tuning engine 110 in any various way supported by modern EDA applications. While modern EDA applications may support the construction of a single 3D layout geometry from an obscured metal stack definition 210 and a reference IC design, the generation of a set of sampled layout geometries 320 from the same reference IC design as provided by the metal stack tuning technology described herein may provide an increased capability to support quantifying effects of parameter value variations for the obscured metal stack definition 210. This increased capability may, in turn, support tuning of selected metal stack parameters 220 to increase the accuracy and effectiveness in parasitic extractions and other circuit verification processes. For instance, the metal stack tuning engine 110 may process the sampled layout geometries 320, e.g., by performing capacitance determination processes consistently used by parasitic extraction processes.

Figure 4:
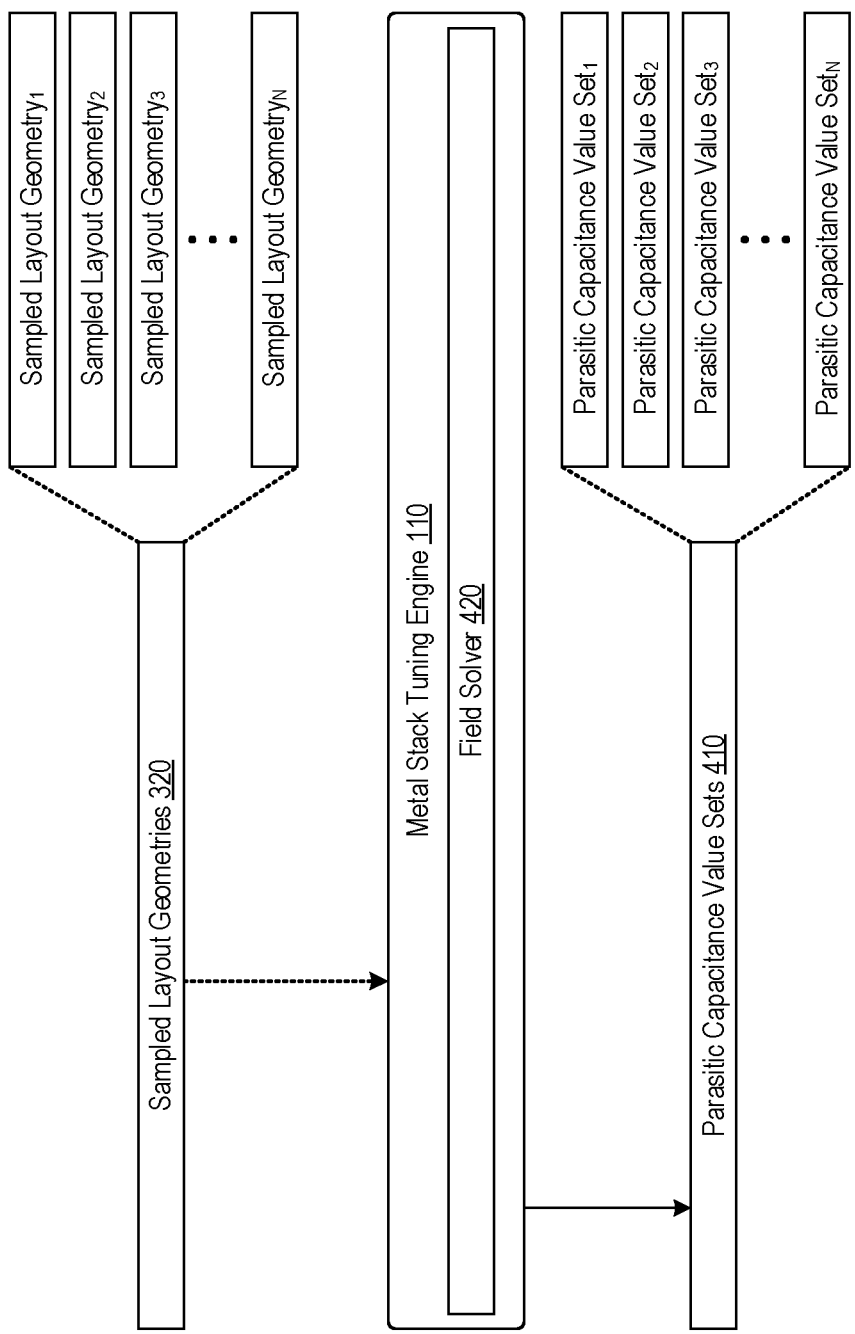
FIG. 4 shows an example computation of parasitic capacitance value sets from sampled layout geometries.

FIG. 4 shows an example computation of parasitic capacitance value sets from sampled layout geometries. In the example of FIG. 4, the metal stack tuning engine 110 computes parasitic capacitance value sets 410 for the sampled layout geometries 320. The parasitic capacitance value sets 410 may take the form of any data structure through which the metal stack tuning engine 110 stores capacitance values determined from the sampled layout geometries 320. Each sampled layout geometry may be a 3D layout geometry that includes a (potentially large) number of IC components such as nets, polygons, or any other IC component of a circuit layout. As such, a particular parasitic capacitance value set computed for a given sampled layout geometry may include parasitic capacitance values computed for the IC components of the given sampled layout geometry.

In some implementations, the metal stack tuning engine 110 may use a field solver 420 to compute capacitance values for the sampled layout geometries 320, and the metal stack tuning engine 110 may implement or otherwise access any type of field solver technology to support and perform capacitance computations for the sampled layout geometries 320. The metal stack tuning engine 110 may represent the parasitic capacitance value sets 410 via lookup structures, for example with an individual parasitic capacitance value set indexed based on a particular sampled metal stack definition used to construct the particular 3D layout geometry from which the individual parasitic capacitance value set was computed. In some implementations, the metal stack tuning engine 110 may index the parasitic capacitance value sets 410 according to the parameter values of the selected metal stack parameters 220, which may uniquely differentiate each of the sampled metal stack definitions 210 (and thus each corresponding parasitic capacitance value set of the parasitic capacitance value sets 410).

In the example of FIG. 3 discussed above, the metal stack tuning engine 110 generates the sampled layout geometries 320 for a single reference IC design 310. However, the metal stack tuning engine 110 is not so limited, and may access multiple reference IC designs, for example physical layouts of multiple reference IC designs. The metal stack tuning engine 110 may generate 3D layout geometries from the multiple physical layouts, doing so for each of the sampled metal stack definitions 210. In this example, sampled layout geometries constructed by the metal stack tuning engine 110 may include multiple 3D layout geometries (for different physical layouts) that are constructed from the same sampled metal stack definition. The metal stack tuning engine 110 may compute capacitance values for each of the 3D layout geometries, and may further index the parasitic capacitance value sets 410 to differentiate between reference IC designs. In some implementations, the metal stack tuning engine 110 may represent (at least logically) the parasitic capacitance value sets 410 as a table-of-tables, with lookup into a first table supported based on metal stack definition (e.g., specific parameter values of the selected metal stack parameters 220) that returns another table. Then, lookup into the returned table (from the first table) may be supported based on an identifier for a particular physical layout (or reference IC design). In other examples, the metal stack tuning engine 110 may represent the parasitic capacitance value sets 410 as a table of models, in which parasitic capacitance values for sampled layout geometries are represented as capacitance models instead of discretely computed values.

The parasitic capacitance value sets 410 may provide a lookup or evaluation structure by which particular parameter values of the selected metal stack parameters 220 can be evaluated on actual physical layouts and circuit designs (e.g., the reference IC design(s)). Lookup into the parasitic capacitance value sets 410 may be based on parameter values of the selected metal stack parameters 220, and, in that regard, the parasitic capacitance value sets 410 may logically represent a function that returns capacitance value outputs (for one or more reference IC designs) based on inputs in the form of parameter values for the selected metal stack parameters 220. Put another way, the parasitic capacitance value sets 410 generated by the metal stack tuning engine 110 may form a "black box" function that evaluates parasitic capacitance values for IC components of circuit physical layouts based on input parameter values for the selected parameter values 220. This (at least logical) function may allow the metal stack tuning engine 110 to determine tuned values for the selected metal stack parameters 220 by fitting the outputs of the parasitic capacitance value sets 410 to golden reference values. Such tuning, which can be performed through curve-fitting, is described in greater detail next with reference to FIG. 5.

Figure 5:
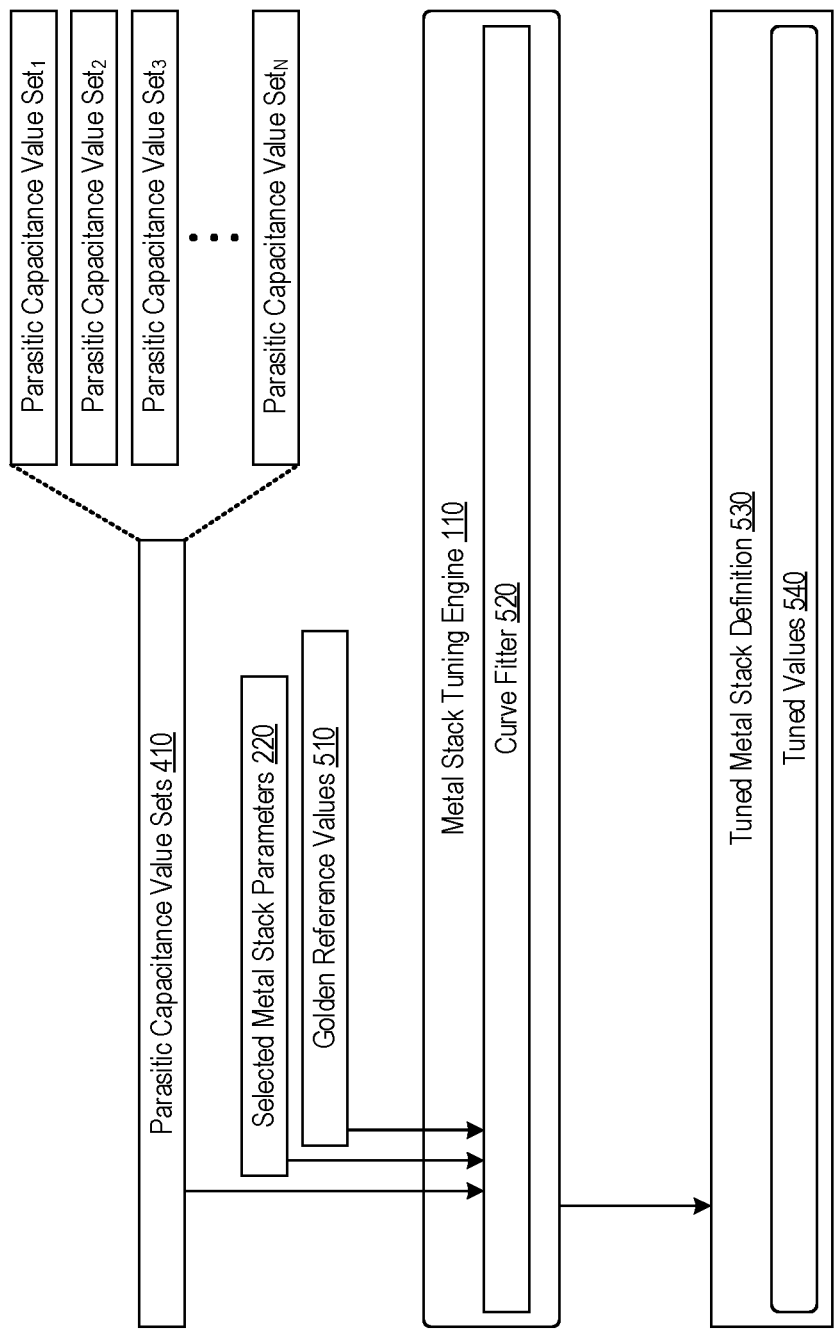
FIG. 5 shows an example determination of tuned values for selected metal stack parameters using computed parasitic capacitance value sets.

FIG. 5 shows an example determination of tuned values for selected metal stack parameters using computed parasitic capacitance value sets. In the example of FIG. 5, the metal stack tuning engine 110 uses the parasitic capacitance value sets 410, the selected metal stack parameters 220, and golden reference values 510 to determine tuned values for the selected metal stack parameters 220. The golden reference values 510 may be capacitance values of the reference IC design 310 computed using an actual metal stack definition, not the obscured metal stack definition 210. In that regard, the golden reference values 510 may reflect actual IC manufacture parameters that will be (or were) used to manufacture the reference IC design 310, and thus represent solved capacitance values that reflect an as-manufactured circuit. The golden reference values 510 may be provided by a foundry that desires to maintain the secrecy or confidentiality of its actual metal stack definition. Thus, the metal stack tuning engine 110 may set the golden reference values 510 as capacitance values determined for the layout geometry of the reference IC design 310 constructed with the actual metal stack definition.

The metal stack tuning engine 110 may utilize any number of curve-fitting techniques in order to determine tuned values of the selected metal stack parameters 220. In general, curve-fitting technologies may provide the capability to determine (e.g., optimize or solve for) specific values for unknown variables of a function in order to fit function outputs to reference values. As used herein, an unknown variable may refer to a variable of a function for which an target (e.g., optimal) value of the unknown variable is to be determined. For example, multivariate non-linear curve-fitting technologies may utilize regression techniques to determine values for unknown variables of a function to optimally fit the function output to the reference values (e.g., as measured by a specified cost function). The metal stack tuning engine 110 may leverage such curve-fitting technologies by, in effect, using the parasitic capacitance value sets 410 as a function with the selected metal stack parameters 220 as inputs. In doing so, the metal stack tuning engine 110 may designate the selected metal stack parameters 220 as the unknown variables for the function represented via the parasitic capacitance value sets 410, for and the particular (e.g., "optimal") parameter values for the unknown variables can be solved by the metal stack tuning engine 110 through a curve-fitting process. These specifically determined values for the unknown variables of the represented function may then be set by the metal stack tuning engine 110 as the tuned values of the selected metal stack parameters 220.

In the example of FIG. 5, the metal stack tuning engine 110 may implement (or otherwise access) a curve fitter 520, which may provide or support any type of curve-fitting technology, including multivariate non-linear regressions and more. For a function that comprises unknown variables that represent the selected metal stack parameters 220, the metal stack tuning engine 110 may use the curve fitter 520 to determine values for these unknown variables (i.e., the selected metal stack parameters 220) that most closely fit the output of the function (represented and evaluated through the parasitic capacitance value sets 410) to the golden reference values 510. Closeness in terms of curve-fitting may be evaluated by the curve fitter 520 through any number of cost functions, such as Euclidean distances, root-mean-square (RMS) errors, relative RMS errors, and more. In some implementations, the metal stack tuning engine 110 sets the cost function for the curve fitter 520 (e.g., based on user selection or system configurations), configures initial values (e.g., as user-input guesses or predetermined guess values) for the unknown variables to be used by the curve fitter 520, or a combination of both.

Thus, through curve-fitting, the metal stack tuning engine 110 may determine the variable values of the unknown variables, which may represent values of the selected metal stack parameters 220 to optimize a fit to the golden reference values 510. That is, the variable values determined for the unknown variables (and thus the selected metal stack parameters 220) may be the tuned values of the selected metal stack parameters 220. In the example of FIG. 5, the metal stack tuning engine 110 employs a curve-fitting process to generate the tuned metal stack definition 530, which includes the tuned values 540. The tuned values 540 may be the variable values determined by the curve-fitter 520 to fit the function represented through the parasitic capacitance value sets 410 to the golden reference values 510. In some sense, the tuned metal stack definition 530 may be understood as a variant of the obscured metal stack definition 210, and one that includes the tuned values 540 as values for the selected metal stack parameters 220 instead of the parameter values for the selected metal stack parameters 220 specified in the obscured metal stack definition 210.

Accordingly, the tuned values 540 determined by the metal stack tuning engine 110 through curve-fitting may be different from the parameter values of the selected metal stack parameters 220 specified in the obscured metal stack definition 210. These tuned values 540, which may be used instead of the parameter values of the selected metal stack parameters 220 specified in the obscured metal stack definition 210, may provide increased accuracy in parasitic extractions and other circuit verification processes as compared to the obscured metal stack definition 210 as the tuned values 540 were determined based on fit to the golden reference values 510 generated using an actual metal stack definition.

Note that the tuned metal stack definition 530 may be different from the actual metal stack definition used by to generate the golden reference values 510. Instead, the tuned metal stack definition 530 may be generated by the metal stack tuning engine 110 to approximate the effects of the actual metal stack definition more closely as compared to the obscured metal stack definition 210, but in a way that maintains the confidentiality or secrecy of at least some metal stack parameter values of the actual metal stack definition. Thus, tuned metal stack definitions generated according to the metal stack tuning technology described herein may provide the technical benefit of increased accuracy in parasitic extractions and other circuit verification processes, without the need to expose an actual metal stack definition (thus allowing foundries to maintain threshold levels of confidentiality and secrecy for circuit manufacture at various technology nodes).

In any of the ways described herein, tuned parameter values for any number of selected metal stack parameters of an obscured metal stack definition may be determined via the metal stack tuning technology provided herein.

Figure 6:
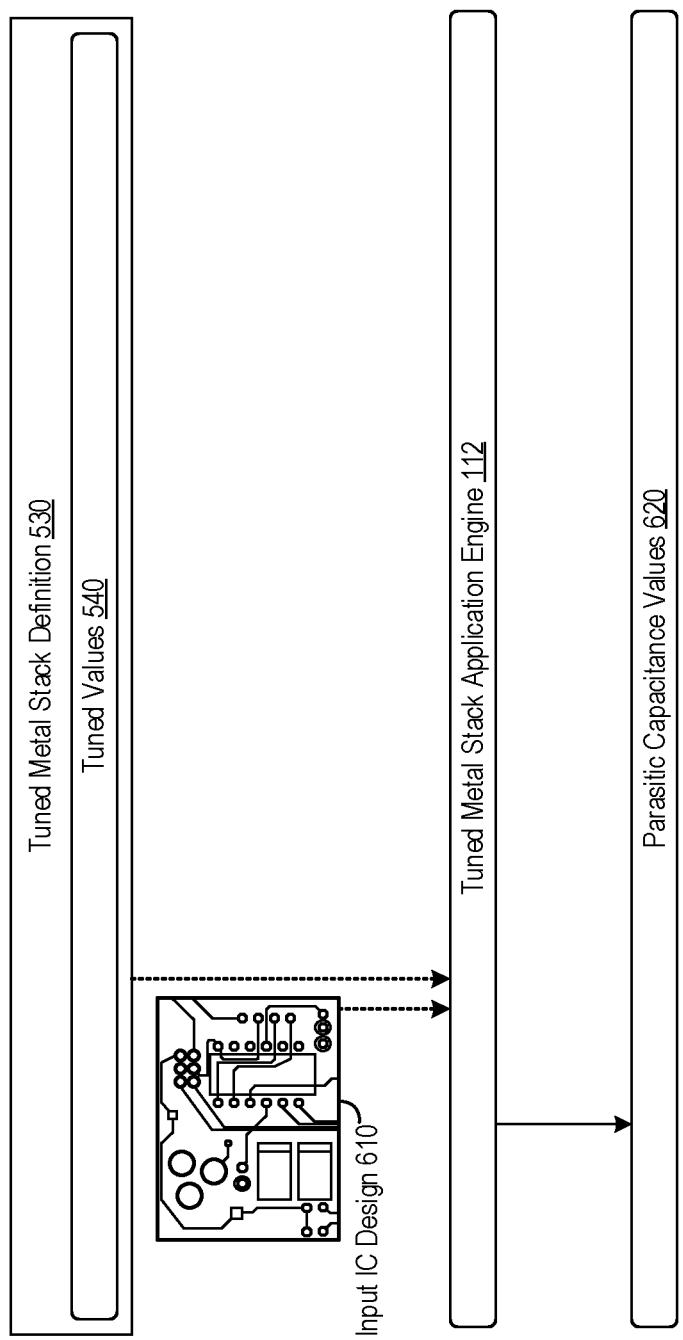
FIG. 6 shows an example application of a tuned metal stack definition to determine parasitic capacitance values for an input IC design.

FIG. 6 shows an example application of a tuned metal stack definition to determine parasitic capacitance values for an input IC design. In FIG. 6, the tuned metal stack application engine 112 uses a tuned metal stack definition 530 (with tuned values 540 for selected metal stack parameters 220) in order to perform a parasitic extraction for an input IC design 610. In particular, the tuned metal stack application engine 112 may use the tuned metal stack definition 530 to perform the parasitic extraction on the input IC design 610 instead of the obscured metal stack definition 210.

As noted herein, the tuned metal stack definition 530 may provide increased accuracy in capacitance determinations in the parasitic extraction process, and at a threshold accuracy level that may be unachievable for parasitic extractions performed using the obscured metal stack definition 210. Note that the input IC design 610 is different from the reference IC design 310 (or designs) used to tune the obscured metal stack definition 210 and generate the tuned metal stack definition 530. The tuned metal stack definition 530 may be broadly applicable to process circuit designs of any type, size, or complexity. For circuit verifications such as parasitic extractions, the tuned metal stack definition 530 may be used instead of the obscured metal stack definition 210. In that regard, the tuned metal stack definition 430 may replace the obscured metal stack definition 210 for parasitic extraction processes. Thus, in using the tuned metal stack definition 530 to perform a parasitic extraction process for the input IC design 610, the tuned metal stack application engine 112 may determine the parasitic capacitance values 620 for the input IC design 610, for example by generating a 3D layout geometry via the tuned metal stack definition 530 and computing the capacitance values through a field solver. In such a manner, the tuned metal stack application engine 112 may apply the tuned metal stack definition 430 in various circuit verification processes.

Figure 7:
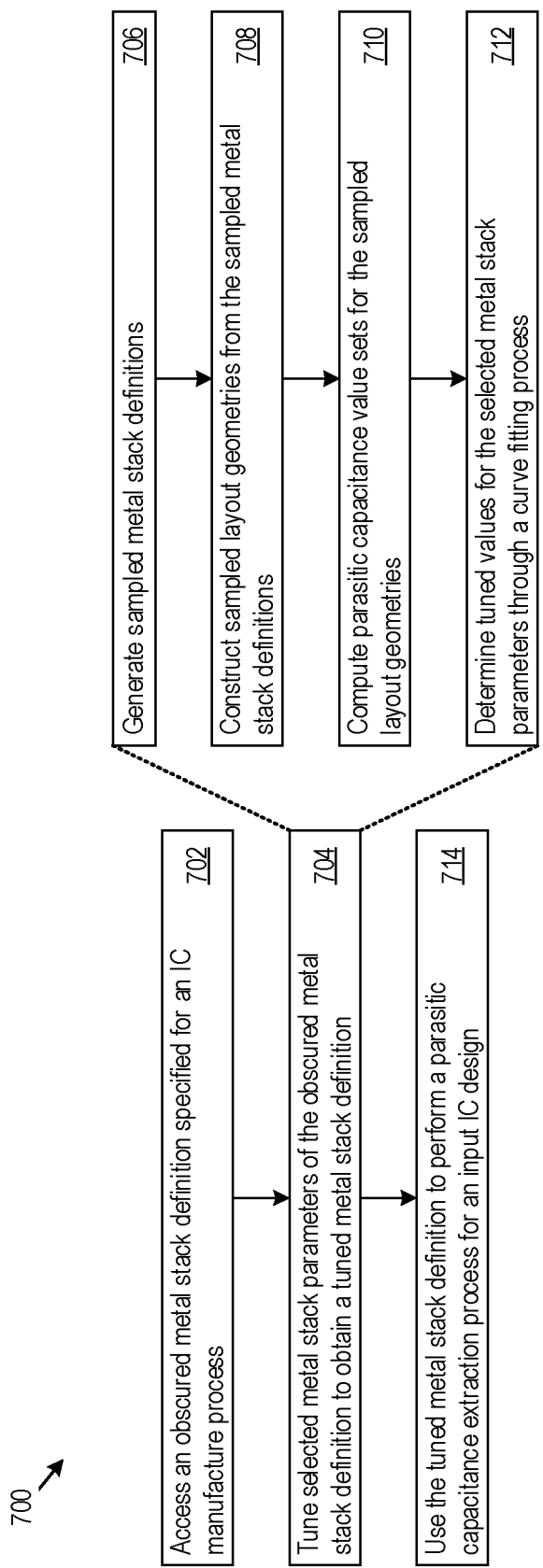
FIG. 7 shows an example of logic that a system may implement to support tuning of obscured metal stack definitions in support of IC manufacture.

FIG. 7 shows an example of logic that a system may implement to support tuning of obscured metal stack definitions in support of IC manufacture. For example, the computing system 100 may implement the logic 700 as hardware, executable instructions stored on a machine-readable medium, or as a combination of both. The computing system 100 may implement the logic 700 via the metal stack tuning engine 110 and the tuned metal stack application engine 112, through which the computing system 100 may perform or execute the logic 700 as a method to tune obscured metal stack definitions. The following description of the logic 700 is provided using the metal stack tuning engine 110 and tuned metal stack application engine 112 as examples. However, other implementation options by computing systems are possible and contemplated herein.

In implementing the logic 700, the metal stack tuning engine 110 may access an obscured metal stack definition specified for an IC (702), and the obscured metal stack definition may include metal stack parameters that are different from actual metal stack parameters of an actual metal stack definition for the IC manufacture process. In implementing the logic 700, the metal stack tuning engine 110 may further tune selected metal stack parameters of the obscured metal stack definition to obtain a tuned metal stack definition (704), including by generating sampled metal stack definitions (706), constructing sampled layout geometries from the sampled metal stack definitions (708), computing parasitic capacitance value sets for the sampled layout geometries (710), and determining tuned values for the selected metal stack parameters through a curve fitting process (712). The metal stack tuning engine 110 may do so in any of the various ways described herein. In implementing the logic 700, the tuned metal stack application engine 112 may use the tuned metal stack definition to perform a parasitic capacitance extraction process for an input IC design (714).

The logic 700 shown in FIG. 7 provides an illustrative example by which a computing system 100 may support tuning obscured metal stack definitions according to the present disclosure. Additional or alternative steps in the logic 700 are contemplated herein, including according to any of the various features described herein for the metal stack tuning engine 110, the tuned metal stack application engine 112, and any combinations thereof.

Figure 8:
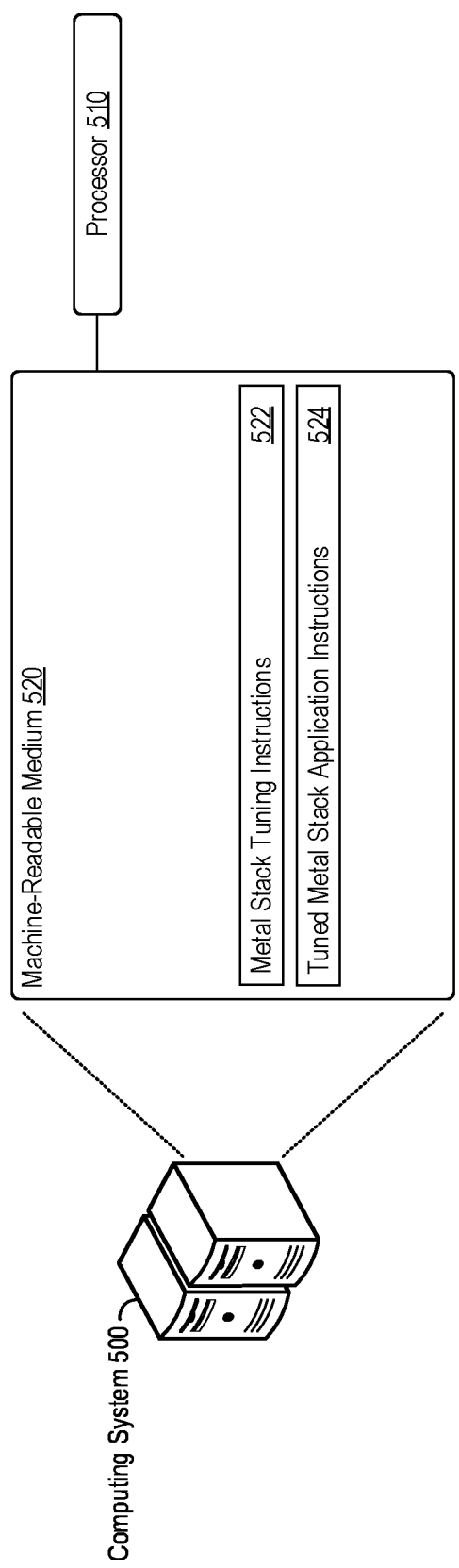
FIG. 8 shows an example of a computing system that supports tuning of obscured metal stack definitions in support of IC manufacture.

FIG. 8 shows an example of a computing system 800 that supports tuning of obscured metal stack definitions in support of IC manufacture. The computing system 800 may include a processor 810, which may take the form of a single or multiple processors. The processor(s) 810 may include a central processing unit (CPU), microprocessor, or any hardware device suitable for executing instructions stored on a machine-readable medium. The computing system 800 may include a machine-readable medium 820. The machine-readable medium 820 may take the form of any non-transitory electronic, magnetic, optical, or other physical storage device that stores executable instructions, such as the metal stack tuning instructions 822 and the tuned metal stack application instructions 824 shown in FIG. 8. As such, the machine-readable medium 820 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 800 may execute instructions stored on the machine-readable medium 820 through the processor 810. Executing the instructions (e.g., the metal stack tuning instructions 822 and/or the tuned metal stack application instructions 824) may cause the computing system 800 to perform any aspect of the metal stack tuning technology described herein, including according to any aspect of the metal stack tuning engine 110, the tuned metal stack application engine 112, or combinations of both.

For example, execution of the metal stack tuning instructions 822 by the processor 810 may cause the computing system 800 to access an obscured metal stack definition specified for an IC manufacture process, and the obscured metal stack definition may include metal stack parameters that are different from actual metal stack parameters of an actual metal stack definition for the IC manufacture process. Execution of the metal stack tuning instructions 822 by the processor 810 may also cause the computing system 800 to tune selected metal stack parameters of the obscured metal stack definition to obtain a tuned metal stack definition, including by generating sampled metal stack definitions, wherein each sampled metal stack definition has a sampled value for each of the selected metal stack parameters, constructing sampled layout geometries from the sampled metal stack definitions, wherein a given sampled layout geometry is constructed from a physical layout of a reference IC design using a given sampled metal stack definition, computing parasitic capacitance value sets for the sampled layout geometries, wherein a parasitic capacitance value set computed for a given sampled layout geometry comprises parasitic capacitance values computed for IC components of the given sampled layout geometry; and determining tuned values for the selected metal stack parameters through a curve fitting process, wherein the tuned values are represented as unknown variables of a function represented through the computed parasitic capacitance value sets that the curve fitting process fits to golden reference values.

Execution of the tuned metal stack application instructions 824 by the processor 810 may cause the computing system 800 to use the tuned metal stack definition to perform a parasitic capacitance extraction process for an input IC design different from the reference IC design.

Any additional or alternative aspects of the metal stack tuning technology as described herein may be implemented via the metal stack tuning instructions 822, the tuned metal stack application instructions 824, or a combination of both.

The systems, methods, devices, and logic described above, including the metal stack tuning engine 110 and the tuned metal stack application engine 112, may be implemented in many different ways in many different combinations of hardware, logic, circuitry, and executable instructions stored on a machine-readable medium. For example, the metal stack tuning engine 110, the tuned metal stack application engine 112, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the metal stack tuning engine 110, the tuned metal stack application engine 112, or combinations thereof.

The processing capability of the systems, devices, and engines described herein, including the metal stack tuning engine 110 and the tuned metal stack application engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
   by a computing system:
   accessing an obscured metal stack definition specified for an integrated circuit (IC) manufacture process, wherein the obscured metal stack definition includes metal stack parameters that are different from actual metal stack parameters of an actual metal stack definition for the IC manufacture process;

tuning selected metal stack parameters of the obscured metal stack definition to obtain a tuned metal stack definition, including by:
  generating sampled metal stack definitions, wherein each sampled metal stack definition has a sampled value for each of the selected metal stack parameters;
  constructing sampled layout geometries from the sampled metal stack definitions, wherein a given sampled layout geometry is constructed from a physical layout of a reference IC design using a given sampled metal stack definition;
  computing parasitic capacitance value sets for the sampled layout geometries, wherein a parasitic capacitance value set computed for a given sampled layout geometry comprises parasitic capacitance values computed for IC components of the given sampled layout geometry; and
  determining tuned values for the selected metal stack parameters through a curve fitting process, wherein the tuned values are represented as unknown variables of a function represented through the computed parasitic capacitance value sets that the curve fitting process fits to golden reference values; and using the tuned metal stack definition to perform a parasitic capacitance extraction process for an input IC design different from the reference IC design.

2. The method of claim 1, further comprising setting the golden reference values for the curve fitting process as capacitance values determined for a layout geometry of the reference IC design constructed with the actual metal stack definition.

3. The method of claim 1, wherein the tuned metal stack definition is different from the actual metal stack definition.

4. The method of claim 1, further comprising identifying the selected metal stack parameters to tune based on user input, default parameter settings, or a combination of both.

5. The method of claim 1, wherein generating the sampled metal stack definitions comprises sampling values for the selected metal stack parameters across a parameter value range specified for the selected metal stack parameters.

6. The method of claim 1, further comprising:
  setting a cost function for the curve fitting process; and
  configuring initial values for the unknown variables to be used in the curve fitting process.

7. The method of claim 1, further comprising limiting a number of the selected metal stack parameters to be tuned through the curve fitting process to be equal to or less than a preconfigured threshold number.

8. A system comprising:
a metal stack tuning engine configured to:
  access an obscured metal stack definition specified for an integrated circuit (IC) manufacture process, wherein the obscured metal stack definition includes metal stack parameters that are different from actual metal stack parameters of an actual metal stack definition for the IC manufacture process; and
  tune selected metal stack parameters of the obscured metal stack definition to obtain a tuned metal stack definition, including by:
    generating sampled metal stack definitions, wherein each sampled metal stack definition has a sampled value for each of the selected metal stack parameters;
    constructing sampled layout geometries from the sampled metal stack definitions, wherein a given sampled layout geometry is constructed from a physical layout of a reference IC design using a given sampled metal stack definition;
    computing parasitic capacitance value sets for the sampled layout geometries, wherein a parasitic capacitance value set computed for a given sampled layout geometry comprises parasitic capacitance values computed for IC components of the given sampled layout geometry; and
    determining tuned values for the selected metal stack parameters through a curve fitting process, wherein the tuned values are represented as unknown variables of a function represented through the computed parasitic capacitance value sets that the curve fitting process fits to golden reference values; and
a tuned metal stack application engine configured to use the tuned metal stack definition to perform a parasitic capacitance extraction process for an input IC design different from the reference IC design.

9. The system of claim 8, wherein the metal stack tuning engine is further configured to set the golden reference values for the curve fitting process as capacitance values determined for a layout geometry of the reference IC design constructed with the actual metal stack definition.

10. The system of claim 8, wherein the tuned metal stack definition is different from the actual metal stack definition.

11. The system of claim 8, wherein the metal stack tuning engine is further configured to identify the selected metal stack parameters to tune based on user input, default parameter settings, or a combination of both.

12. The system of claim 8, wherein the metal stack tuning engine is configured to generate the sampled metal stack definitions by sampling values for the selected metal stack parameters across a parameter value range specified for the selected metal stack parameters.

13. The system of claim 8, wherein the metal stack tuning engine is further configured to:
  set a cost function for the curve fitting process; and
  configure initial values for the unknown variables to be used in the curve fitting process.

14. The system of claim 8, wherein the metal stack tuning engine is further configured to limit a number of the selected metal stack parameters to be tuned through the curve fitting process to be equal to or less than a preconfigured threshold number.

15. A non-transitory machine-readable medium comprising instructions that, when executed by a processor, cause a computing system to:
  access an obscured metal stack definition specified for an integrated circuit (IC) manufacture process, wherein the obscured metal stack definition includes metal stack parameters that are different from actual metal stack parameters of an actual metal stack definition for the IC manufacture process;
  tune selected metal stack parameters of the obscured metal stack definition to obtain a tuned metal stack definition, including by:
    generating sampled metal stack definitions, wherein each sampled metal stack definition has a sampled value for each of the selected metal stack parameters;
    constructing sampled layout geometries from the sampled metal stack definitions, wherein a given sampled layout geometry is constructed from a physical layout of a reference IC design using a given sampled metal stack definition;

computing parasitic capacitance value sets for the sampled layout geometries, wherein a parasitic capacitance value set computed for a given sampled layout geometry comprises parasitic capacitance values computed for IC components of the given sampled layout geometry; and determining tuned values for the selected metal stack parameters through a curve fitting process, wherein the tuned values are represented as unknown variables of a function represented through the computed parasitic capacitance value sets that the curve fitting process fits to golden reference values; and use the tuned metal stack definition to perform a parasitic capacitance extraction process.

16. The non-transitory machine-readable medium of claim 15, wherein the instructions further cause the computing system to set the golden reference values for the curve fitting process as capacitance values determined for a layout geometry of the reference IC design constructed with the actual metal stack definition.

17. The non-transitory machine-readable medium of claim 15, wherein the tuned metal stack definition is different from the actual metal stack definition.

18. The non-transitory machine-readable medium of claim 15, wherein the instructions further cause the computing system to identify the selected metal stack parameters to tune based on user input, default parameter settings, or a combination of both.

19. The non-transitory machine-readable medium of claim 15, wherein the instructions cause the computing system to generate the sampled metal stack definitions by sampling values for the selected metal stack parameters across a parameter value range specified for the selected metal stack parameters.

20. The non-transitory machine-readable medium of claim 15, wherein the instructions further cause the computing system to set a cost function for the curve fitting process and configure initial values for the unknown unknown to be used in the curve fitting process.

* * * * *